(12) United States Patent
Xu

(10) Patent No.: US 10,673,268 B2
(45) Date of Patent: Jun. 2, 2020

(54) MULTIPHASE CHARGING CIRCUIT WITH IMPROVED TRANSIENT RESPONSE AND CONTROL METHOD THEREOF

(71) Applicant: Chengdu Monolithic Power Systems Co. Ltd., Chengdu (CN)

(72) Inventor: Min Xu, Hangzhou (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 0 days.

(21) Appl. No.: 16/218,458

(22) Filed: Dec. 12, 2018

(65) Prior Publication Data

US 2019/0190279 A1 Jun. 20, 2019

(51) Int. Cl.
| | |
|---|---|
| H02J 7/04 | (2006.01) |
| H02M 3/158 | (2006.01) |
| H02J 7/00 | (2006.01) |
| G05F 1/46 | (2006.01) |
| H03K 5/24 | (2006.01) |
| H02J 7/02 | (2016.01) |
| H02M 1/00 | (2006.01) |

(52) U.S. Cl.
CPC .............. *H02J 7/008* (2013.01); *G05F 1/462* (2013.01); *H02J 7/00* (2013.01); *H02J 7/022* (2013.01); *H02J 7/045* (2013.01); *H02M 3/1584* (2013.01); *H03K 5/249* (2013.01); H02J 2207/20 (2020.01); H02M 2001/0003 (2013.01); H02M 2003/1586 (2013.01)

(58) Field of Classification Search
CPC .......... H02J 7/0052; H02J 7/008; H02J 7/022; H02J 7/045; H02J 2007/0059; G05F 1/462; H03K 5/249; H02M 3/156; H02M 3/157; H02M 3/158; H02M 3/1584; H02M 3/285; H02M 2003/1586; H02M 2001/0003; H02M 2001/0012; H02M 2001/0016; H02M 2001/0019; H02M 2001/0025

See application file for complete search history.

(56) References Cited

U.S. PATENT DOCUMENTS

| | | |
|---|---|---|
| 9,391,516 B2 | 7/2016 | Bai et al. |
| 9,431,845 B2 | 8/2016 | Xu et al. |
| 9,711,975 B2 | 7/2017 | Xu et al. |
| 10,063,078 B2 | 8/2018 | Xu et al. |
| 10,116,155 B2 | 10/2018 | Xu et al. |

(Continued)

*Primary Examiner* — Gary L Laxton
*Assistant Examiner* — Ivan Laboy
(74) *Attorney, Agent, or Firm* — Perkins Coie LLP

(57) ABSTRACT

A multiphase charging circuit includes a first phase having a first switch and a second phase having a second switch to provide a system voltage for a system load, a control method of the multiphase charging circuit includes: generating a plurality of feedback control signals with generating each of feedback control signal based on a corresponding feedback signal, a ramp signal, a corresponding reference signal and a current flowing through the first phase; selecting one of the plurality of feedback control signals as a first enable signal; generating a first control signal of the first switch based on the first enable signal and a first time period control signal; generating a second enable signal by shifting a pre-determined phase difference to the first control signal; and generating a second control signal of the second switch based on the second enable signal and a second time period control signal.

18 Claims, 12 Drawing Sheets

(56) References Cited

U.S. PATENT DOCUMENTS

| | | | | |
|---|---|---|---|---|
| 2006/0082943 A1* | 4/2006 | Chiu | .................... | H02M 3/1584 |
| | | | | 361/93.1 |
| 2008/0116865 A1* | 5/2008 | Rice | .................... | H02M 3/1584 |
| | | | | 323/280 |
| 2011/0025284 A1* | 2/2011 | Xu | ...................... | H02M 3/1584 |
| | | | | 323/282 |
| 2011/0057632 A1* | 3/2011 | Cheng | ................... | H02M 3/156 |
| | | | | 323/234 |
| 2016/0164414 A1* | 6/2016 | Hang | .................. | H02M 3/1584 |
| | | | | 323/271 |
| 2016/0226264 A1 | 8/2016 | Xu et al. | | |
| 2016/0226285 A1 | 8/2016 | Xu et al. | | |
| 2016/0301303 A1* | 10/2016 | Bari | ....................... | H02M 3/156 |
| 2017/0187213 A1* | 6/2017 | Xu | ........................ | H02J 7/0052 |

\* cited by examiner

MULTIPHASE CHARGING CIRCUIT WITH IMPROVED TRANSIENT RESPONSE AND CONTROL METHOD THEREOF

CROSS-REFERENCE TO RELATED APPLICATIONS

This application claims the benefit of CN application 201711386983.7, filed on Dec. 20, 2017, and incorporated herein by reference.

TECHNICAL FIELD

The present invention relates generally to electrical circuits, and more particularly but not exclusively to multiphase charging circuits.

BACKGROUND

With the development seen in electronic product market, battery powered products or device such as, for example ultra-books and smart phones, have more tendency to have compact profile and thin shape. However, the requirement for the system power rating and battery capacity is still not reduced. As a result, the components with a higher height will trip over a thinner and lighter design, especially, the inductor height becomes the bottleneck of the new design.

SUMMARY

Embodiments of the present invention are directed to a multiphase charging circuit, wherein the multiphase charging circuit comprises: a plurality of switching phases configured to receive an input voltage and provide a system voltage for a system load, wherein only one of the phases is a master phase having a first switch, and other phases are slave phases; a plurality of feedback control circuits configured to provide a plurality of feedback control signals, wherein each of feedback control circuits is configured to receive a corresponding feedback signal, a ramp signal, a corresponding reference signal and a first current signal representative of a current flowing through the master phase and provide a corresponding feedback control signal based on the corresponding feedback signal, the ramp signal, the corresponding reference signal and the first current signal; a logic grouping circuit having a plurality of input terminals configured to receive the plurality of feedback control signals and an output terminal configured to select one of the plurality of feedback control signals as a first enable signal; a master time period control circuit configured to generate a master time period control signal; a master logic circuit configured to receive the first enable signal and the master time period control signal and provide a first control signal to control the first switch; a pulse generating circuit having an input terminal configured to receive the first control signal and a plurality of output terminals configured to provide a plurality of slave enable signals, wherein each of slave enable signals is generated by shifting the first control signal a corresponding phase difference; a plurality of slave time period control circuits with each of slave time period control circuits configured to provide the corresponding slave time period control signal; and a plurality of slave logic circuits with each of slave logic circuits configured to receive the corresponding slave enable signal and the corresponding slave time period control signal and provide a corresponding slave control signal to control a switch of the corresponding slave phase.

BRIEF DESCRIPTION OF THE DRAWING

Non-limiting and non-exhaustive embodiments are described with reference to the following drawings. The drawings are only for illustration purpose. These drawings are not necessarily drawn to scale. The relative sizes of elements illustrated by the drawings may differ from the relative size depicted.

The use of the same reference label in different drawings indicates the same or like components.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
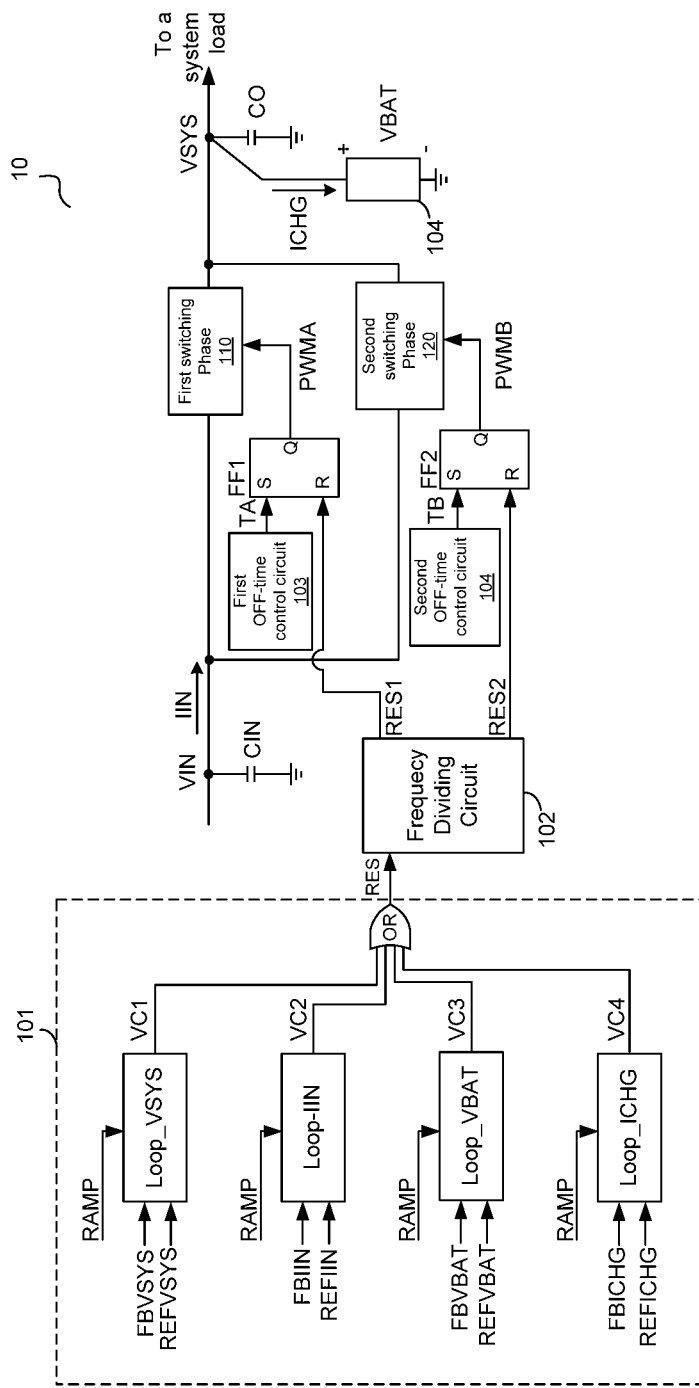
FIG. 1 shows an interleaved two-phase charging circuit 10.

FIG. 1 shows an interleaved two-phase charging circuit 10. In the embodiment of FIG. 1, the interleaved two-phase charging circuit 10 is configured to receive an input voltage VIN and provide a system voltage VSYS to a system load, and/or provide a charging current ICHG to a battery 104. The interleaved two-phase charging circuit 10 comprises a first switching phase 110 having a first switch, a second switching phase 120 having a second switch, a feedback control circuit 101, a frequency dividing circuit 102, a first OFF-time control circuit 103, a second OFF-time control circuit 104, a first flip-flop FF1 and a second flip-flop FF2. An output capacitor CO coupled between the system voltage VSYS and a ground is the common capacitor for both the phases.

Figure 2:
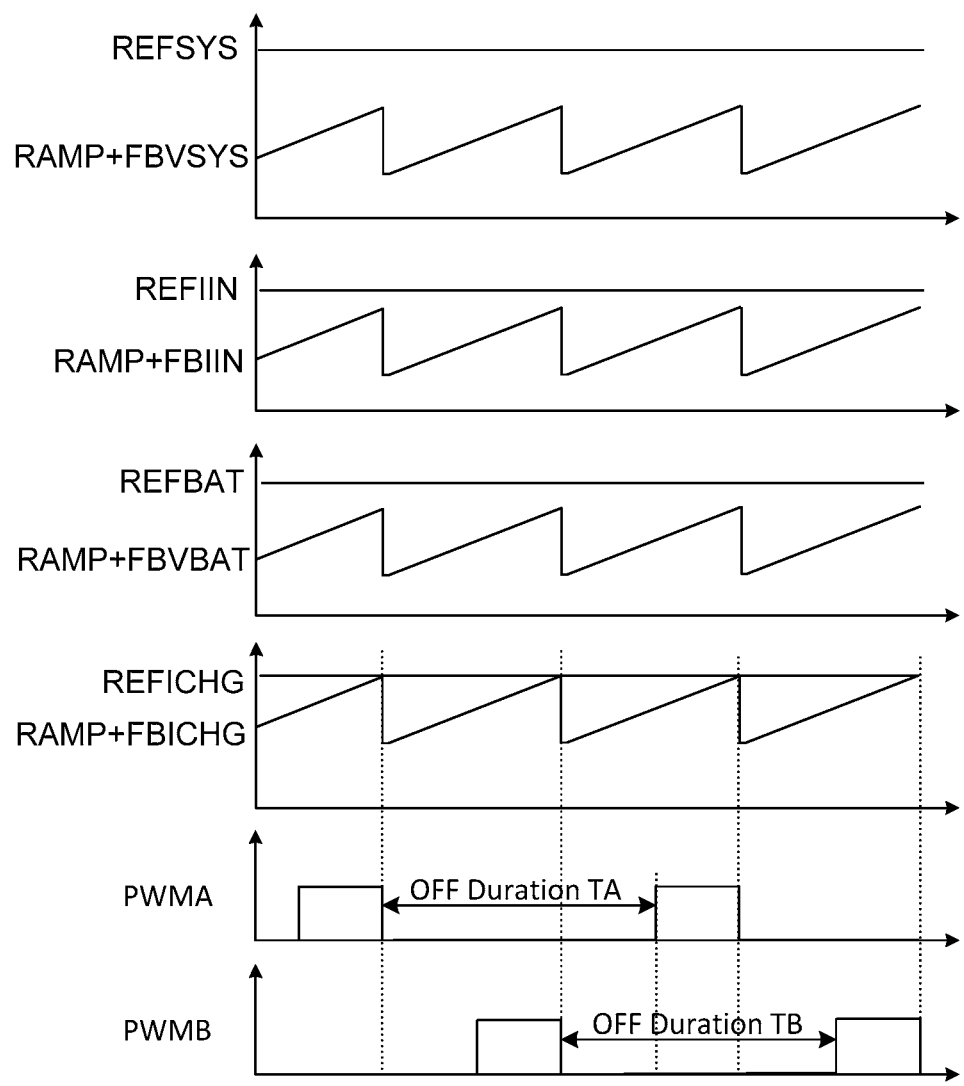
FIG. 2 shows a waveform diagram of signals of the interleaved two-phase charging circuit 10.

FIG. 2 shows a waveform diagram of signals of the interleaved two-phase charging circuit 10. As shown in FIG. 2, once a predetermined state is detected, for example, when the sum of a charging current feedback signal FBICHG and a ramp signal RAMP is increased to a charging current reference signal REFICHG, an enable signal RES outputted by the feedback control circuit 101 is switched to being active (e.g. the enable signal RES becomes high). The frequency dividing circuit 102 is configured to receive the enable signal RES and divide the pulse of the enable signal RES into two sequences orderly, wherein one sequence is configured to form a first frequency dividing signal RES1 to turn OFF the first switch, and the other sequence is configured to form a second frequency dividing signal RES2 to turn OFF the second switch. The first switch and the second switch are turned OFF alternatively because a first control signal PWMA and a second control signal PWMB are out of phase. Subsequently, the first switch is turned ON when the OFF-time of the first switch reaches to a constant OFF-time duration TA. The second switch is turned ON when the OFF-time of the second switch reaches to a constant OFF-time duration TB.

The feedback signal ripple, especially the ripple of the input current feedback signal FBIIN is usually significant, which needs to increase the ramp signal to provide the system stability. However, although the high ramp signal may help to provide system stability, which negatively influence the load regulation and transient response of the two-phase charging circuit 10.

Figure 3:
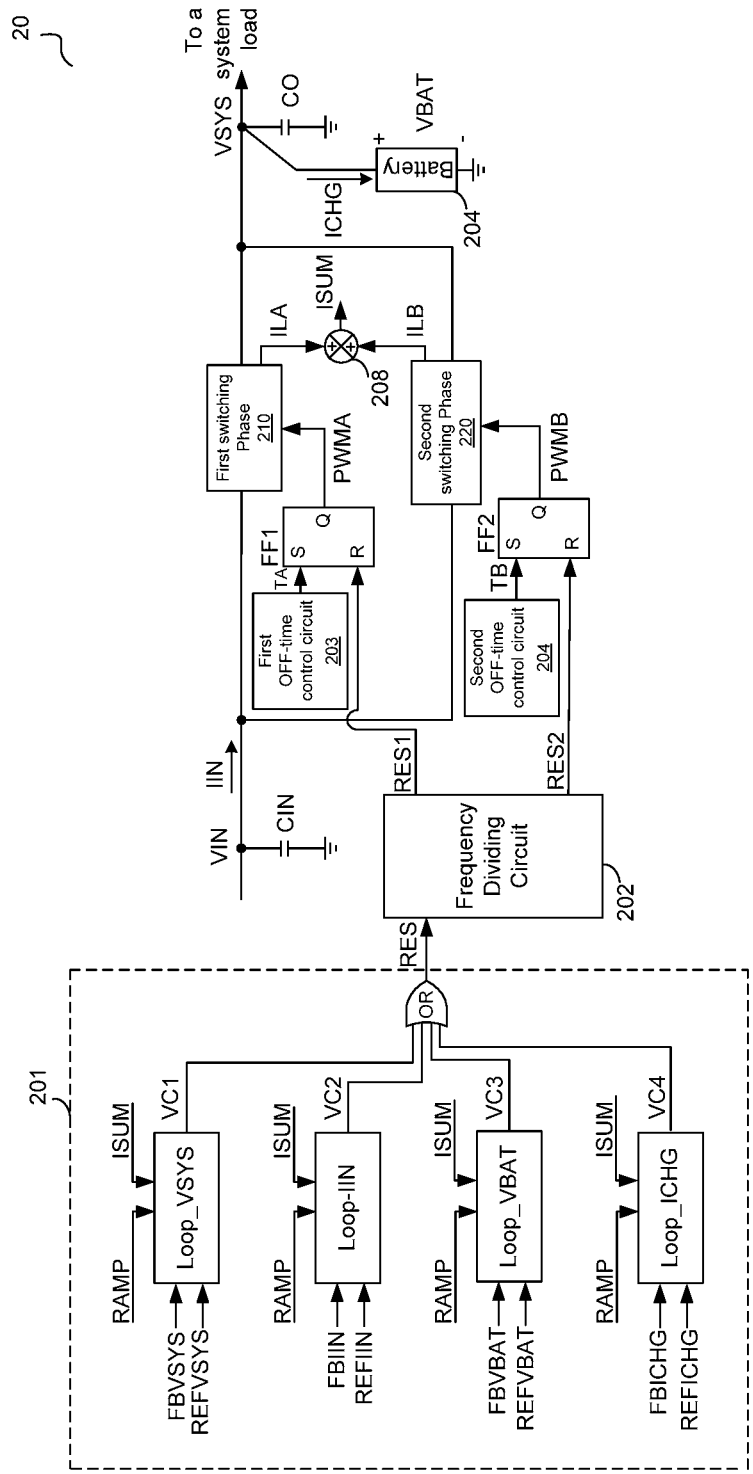
FIG. 3 shows another interleaved two-phase charging circuit 20.

FIG. 3 shows another interleaved two-phase charging circuit 20. In the example of FIG. 3, the interleaved two-phase charging circuit 20 comprises a first switching phase 210 having a first switch, a second switching phase 220 having a second switch, a feedback control circuit 201, a frequency dividing circuit 202, a first OFF-time control circuit 203, a second OFF-time control circuit 204, a first flip-flop FF1, a second flip-flop FF2 and a summing circuit 208. The two-phase charging circuit 20 of FIG. 3 is different from the two-phase charging circuit 10 of FIG. 1 in that the summing circuit 208 is further included. The summing circuit 208 is configured to receive the inductor currents ILA and ILB having a phase difference of 180° and provide a sum current ISUM. Due to the phase difference of 180°, the effective magnitude of the ac ripple current of the sum current ISUM is much less than the magnitude of the ac ripple current of either of the inductor currents ILA and ILB, especially, when the two-phase charging circuit 20 operates at the duty cycle of 0.5, the effective magnitude of the ac ripple current of the sum current ISUM is nearly zero. For a single phase charging circuit, conventionally, the system stability can be improved by adding the ac information of an inductor current into a feedback control circuit. However, in the two-phase charging circuit 20, because the effective magnitude of the ac ripple current of the sum current ISUM is nearly zero, the system stability cannot be improved through the summing circuit 208.

Figure 4:
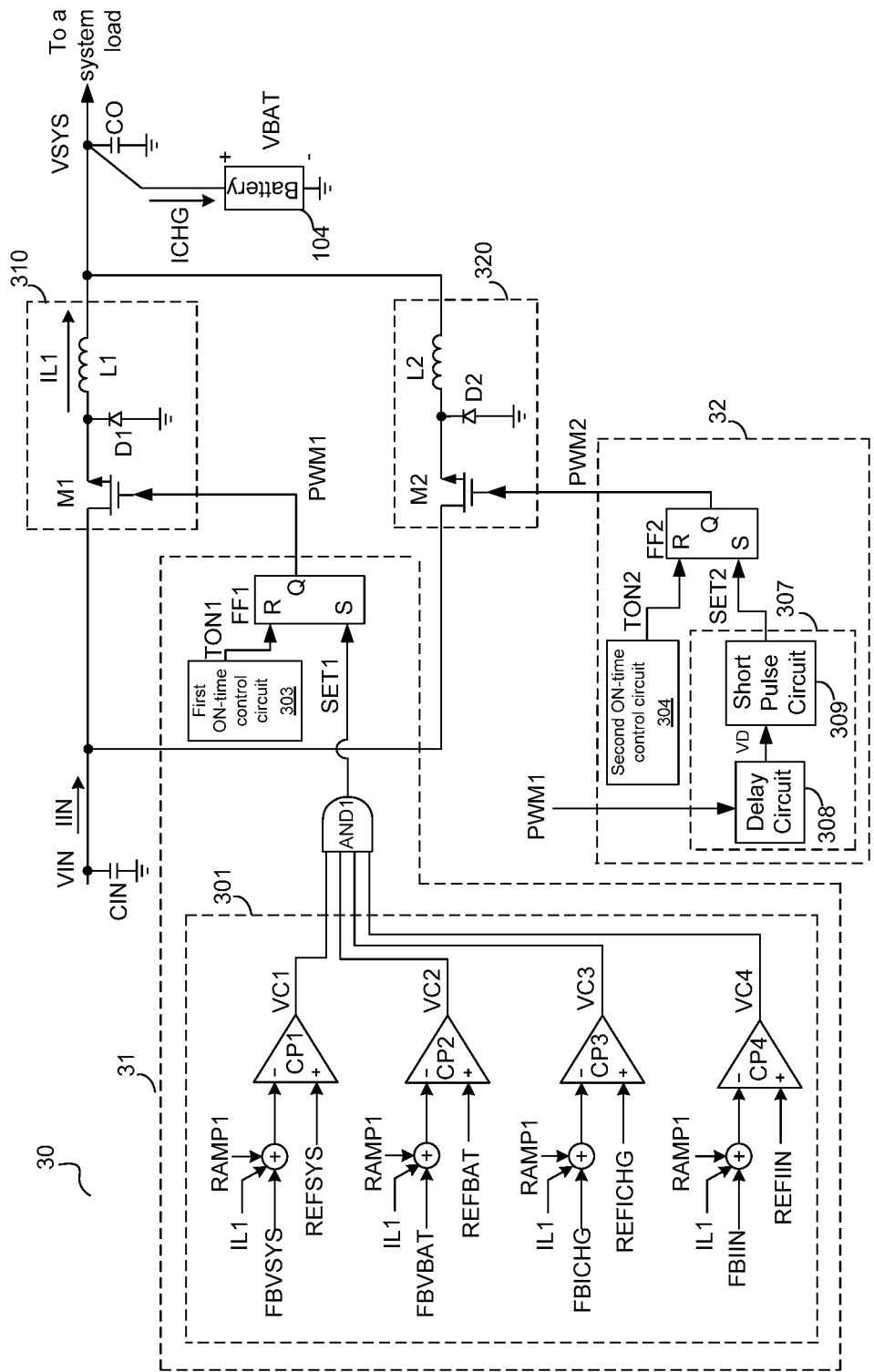
FIG. 4 shows a schematic diagram of a two-phase charging circuit 30 in accordance with an embodiment of the present invention.

FIG. 4 shows a schematic diagram of a two-phase charging circuit 30 in accordance with an embodiment of the present invention. In the embodiment of FIG. 4, the two-phase charging circuit 30 comprises an input capacitor CIN coupled an input voltage VIN and a ground, an output capacitor CO coupled between a system voltage VSYS and the ground, a first switching phase 310 having a first switch M1, a diode D1 and an inductor L1, a second switching phase 320 having a second switch M2, a diode D2 and an inductor L2, and a control circuit. Several examples using a two-phase buck charging circuit are presented, however, it will be understood that other multiphase converter topologies are possible. The first switching phase 310 and the second switching phase 320 may be configured to receive the input voltage VIN and provide the system voltage VSYS to a system load, and/or provide a charging current ICHG to a battery 104.

In the embodiment of FIG. 4, the control circuit comprises a first control circuit 31 and a second control circuit 32, wherein the first control circuit 31 comprises a plurality of feedback control circuits 301, a AND gate circuit AND1, a first ON-time control circuit 303 and a RS flip-flop FF1.

The plurality of feedback control circuits 301 is configured to generate a plurality of feedback control signals. Each of feedback control circuits is configured to receive a corresponding feedback signal, a ramp signal, a corresponding reference signal and a first current signal IL1 representative of a current flowing through the first switching phase 310 and provide a corresponding feedback control signal at an output terminal based on the corresponding feedback signal, the ramp signal, the corresponding reference signal and the first current signal IL1.

In the embodiment of FIG. 4, the plurality of feedback control circuits 301 comprises a first comparator CP1 to form a system voltage feedback control circuit, a second comparator CP2 to form a battery voltage feedback control circuit, a third comparator CP3 to form a charging current feedback control circuit and a fourth comparator CP4 to form an input current feedback control circuit. In other embodiments, the plurality of feedback control circuits 301 may receive other type feedback signals such as, for example, an input voltage feedback signal and a temperature feedback signal, and provide the corresponding feedback control signals.

The first comparator CP1 has an inverting input terminal, a non-inverting input terminal and an output terminal, wherein the inverting input terminal is configured to receive the sum of a system voltage feedback signal FBVSYS, a ramp signal RAMP1 and the first current signal IL1, the non-inverting input terminal is configured to receive a system voltage reference signal REFVSYS. The first comparator CP1 is configured to provide a system voltage feedback control signal VC1 at the output terminal based on the system voltage reference signal REFVSYS, the system voltage feedback signal FBVSYS, the ramp signal RAMP1 and the first current signal IL1.

The second comparator CP2 has an inverting input terminal, a non-inverting input terminal and an output terminal, wherein the inverting input terminal is configured to receive the sum of a battery voltage feedback signal FBVBAT, the ramp signal RAMP1 and the first current signal IL1, the non-inverting input terminal is configured to receive a battery voltage reference signal REFVBAT. The second comparator CP2 is configured to provide a battery voltage feedback control signal VC2 at the output terminal based on the battery voltage reference signal REFVBAT, the battery voltage feedback signal FBVBAT, the ramp signal RAMP1 and the first current signal IL1.

The fourth comparator CP4 has an inverting input terminal, a non-inverting input terminal and an output terminal, wherein the inverting input terminal is configured to receive the sum of an input current feedback signal FBIIN, the ramp signal RAMP1 and the first current signal IL1, the non-inverting input terminal is configured to receive an input current reference signal REFIIN. The fourth comparator CP4 is configured to provide an input current feedback control signal VC4 at the output terminal based on the input current reference signal REFIIN, the input current feedback signal FBIIN, the ramp signal RAMP1 and the first current signal IL1.

The third comparator CP3 has an inverting input terminal, a non-inverting input terminal and an output terminal, wherein the inverting input terminal is configured to receive the sum of a charging current feedback signal FBICHG, the ramp signal RAMP1 and the first current signal IL1, the non-inverting input terminal is configured to receive a charging current reference signal REFICHG. The third comparator CP3 is configured to provide a charging current feedback control signal VC3 at the output terminal based on the charging current reference signal REFICHG, the charging current feedback signal FBICHG, the ramp signal RAMP1 and the first current signal IL1.

The AND gate circuit AND1 has four input terminals configured to receive the feedback control signals VC1~VC4 respectively and an output terminal configured to provide a first enable signal SET1. The first ON-time control circuit 303 is configured to provide a ON-time control signal TON1, which is used to control the ON-time of the first switch M1. The RS flip-flop FF1 has a setting terminal, a resetting terminal and an output terminal, wherein the setting terminal is configured to receive the first enable signal SET1, the resetting terminal is configured to receive the first ON-time control signal TON1, the RS flip-flop FF1 is configured to provide a first control signal PWMM1 at the output terminal to control the first switch M1 based on the first enable signal SET1 and the first ON-time control signal TON1.

As shown in FIG. 4, the second control circuit 32 comprises a pulse generating circuit 307, a second ON-time control circuit 304 and a RS flip-flop FF2. The pulse generating circuit 307 is configured to receive the first control signal PWM1 and provide a second enable signal SET2 by shifting a pre-determined phase difference to the first control signal PWM1. In the embodiment of FIG. 4, there is a pre-determined phase difference of 180° between the first control signal PWM1 and the second enable signal SET2.

In one embodiment, the pulse generating circuit 307 comprises a delay circuit 308 and a first short pulse circuit 309. The delay circuit 308 has an input terminal and an output terminal, wherein the input terminal is configured to receive the first control signal PWM1 and provide a delay signal VD at the output terminal. Wherein there is the phase difference of 180° between the first control signal PWM1 and the delay signal VD. The first short pulse circuit 309 is coupled to the output terminal of the delay circuit 308 to receive the delay signal VD and is configured to provide the second enable signal SET2 having a short pulse at an output terminal. The second ON-time control circuit 304 is configured to provide a second ON-time control signal TON2 at the output terminal. The second ON-time control signal TON2 is configured to control the ON-time of the second switch M2. The RS flip-flop FF2 has a setting terminal, a resetting terminal and an output terminal, wherein the setting terminal is configured to receive the second enable signal SET2, the resetting terminal is configured to receive the second ON-time control signal TON2, and the RS flip-flop FF2 is configured to provide a second control signal PWM2 at the output terminal to control the second switch M2 based on the second enable signal SET2 and the second ON-time control signal TON2.

Figure 5:
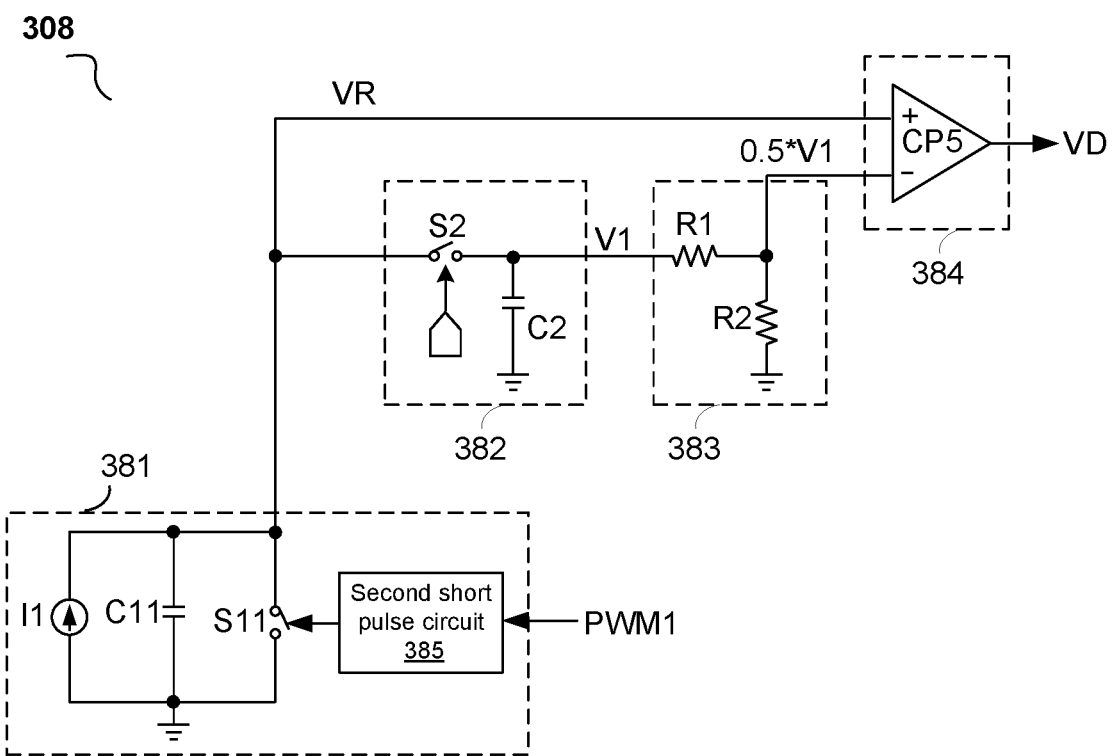
FIG. 5 shows a circuit diagram of the delay circuit 308 shown in FIG. 4 in accordance with an embodiment of the present invention.

FIG. 5 shows a circuit diagram of the delay circuit 308 shown in FIG. 4 in accordance with an embodiment of the present invention. In the embodiment of FIG. 5, the delay circuit 308 comprises a first voltage generating circuit 381, a sample and hold circuit 382, a divider circuit 383 and a comparison circuit 384.

The first voltage generating circuit 381 is configured to generate a first voltage VR, wherein the first voltage VR is pulled down to zero when the first switch M1 is turned ON, then the first voltage VR increases with a slew rate until the first switch M1 is turned ON again in the next switching cycle. As shown in FIG. 5, the first voltage generating circuit 381 comprises a second short pulse circuit 385, a discharge switch S11, a charge capacitor C11 and a charge current source 11. The second short pulse circuit 385 is configured to receive the first control signal PWM1 and provide a second short pulse signal at an output terminal. The discharge switch S11 has a first terminal, a second terminal and a control terminal, wherein the first terminal is configured to provide the first voltage VR, the second terminal is coupled to the ground, the control terminal is coupled to the second short pulse circuit 385 to receive the second short pulse signal. The charge capacitor C11 has a first terminal and a second terminal, wherein the first terminal is coupled to the first terminal of the discharge switch S11, the second terminal is coupled to the ground. The charge current source 11 has an input terminal and an output terminal, wherein the input terminal is coupled to the ground, the output terminal is coupled to the first terminal of the charge capacitor C11.

The sample and hold circuit 382 is configured to sample and hold a maximum value V1 of the first voltage VR and comprises a sample switch S2 and a sample capacitor C2. The divider circuit 383 is configured to divide the maximum value V1 of the first voltage VR and provide a second voltage V2, wherein the second voltage V2 is proportional to the phase difference of 180° between the first control signal PWM1 and the second enable signal SET2. The divider circuit 383 comprises a resistor divider comprising resistors R1 and R2. In the embodiment of FIG. 5, the second voltage $V2=0.5*V1$. The comparison circuit 384 is configured to compare the first voltage VR with the second voltage V2 and provide the delay signal VD. The comparison circuit 384 comprises a comparator CP5 having a non-inverting input terminal, an inverting input terminal and an output terminal, wherein the non-inverting input terminal is configured to receive the first voltage VR, the inverting input terminal is configured to receive the second voltage V2, and the output terminal is configured to provide the delay signal VD to the first short pulse circuit 309.

Figure 6:
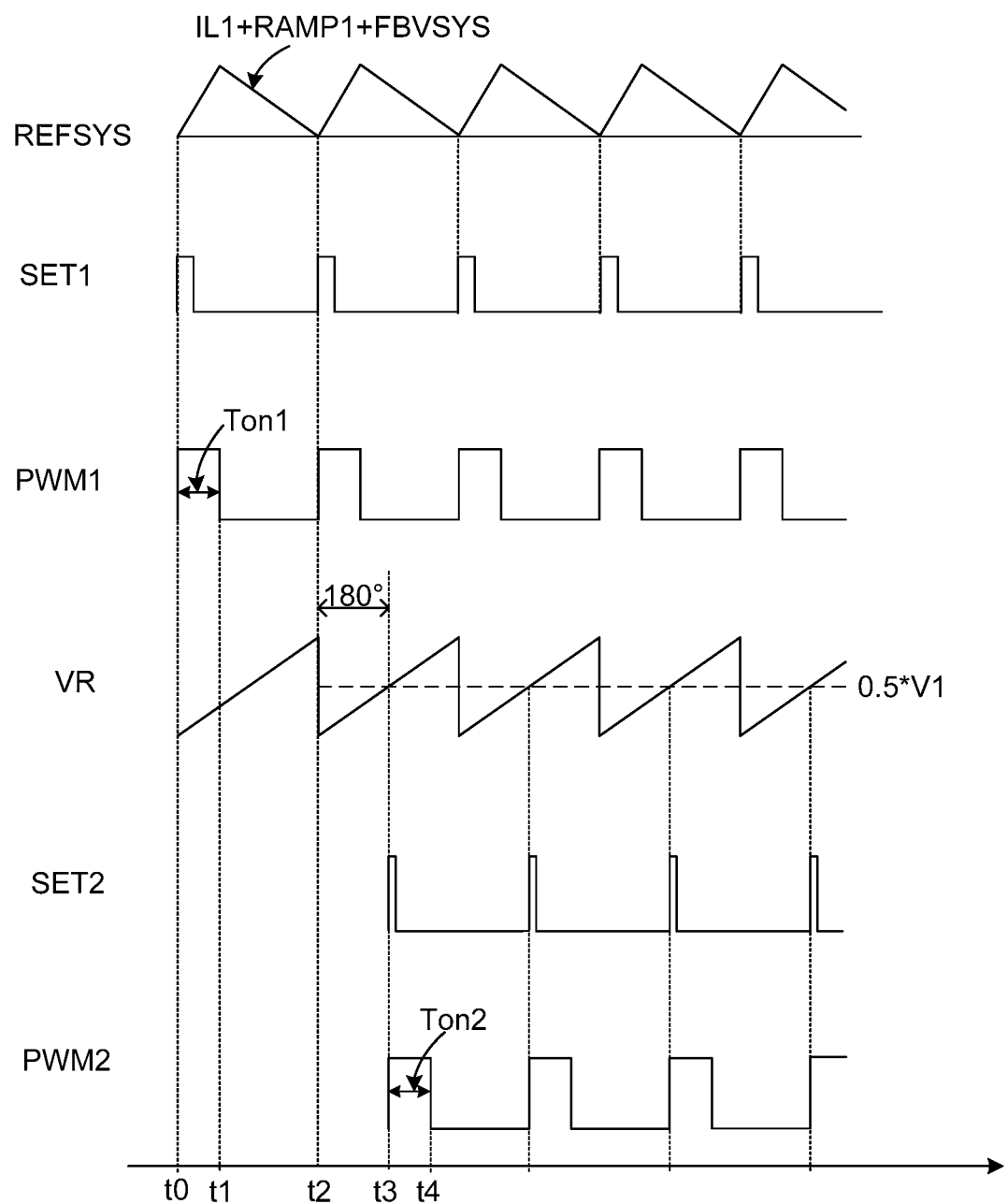
FIG. 6 shows a waveform diagram of signals of the two-phase charging circuit 30 shown in FIG. 4 working based on the system voltage feedback control circuit in accordance with an embodiment of the present invention.

FIG. 6 shows a waveform diagram of signals of the two-phase charging circuit 30 shown in FIG. 4 in operation based on the system voltage feedback control circuit in accordance with an embodiment of the present invention. Several of the details of the embodiments described below with reference to FIGS. 4-6. Below the operation of the system voltage feedback control circuit is explained as an example of the operation of the feedback control circuits 301 of the two-phase charging circuit 30 shown in FIG. 4.

As shown in FIG. 6, in the one hand, for the first switching phase 310, at time t0, the sum of the system voltage feedback signal FBVSYS, the ramp signal RAMP1 and the first current signal IL1 is decreased to reach the system voltage reference signal REFVSYS, and the system voltage feedback control signal VC1 is switched to being active with logic high. Via the AND gate circuit AND1, the system voltage feedback control signal VC1 sets the RS flip-flop FF1 as the first enable signal SET1. Then the first control signal PWM1 is generated with logic high. As a result, the first switch M1 is turned ON. At time t1, i.e. after a constant ON-time Ton1 of the first switch M1 which is determined by the first ON-time control signal TON1, the RS flip-flop FF1 is reset and the first control signal PWM1 becomes logic low from logic high, and thus the first switch M1 is turned OFF. Subsequently, at time t2, when the sum of the system voltage feedback signal FBVSYS, the ramp signal RAMP1 and the first current signal IL1 is decreased to reach the system voltage reference signal REFVSYS again, the system voltage feedback control signal VC1 is switched to being active with logic high. Via the AND gate circuit AND1, the system voltage feedback control signal VC1 sets the RS flip-flop FF1 again as the first enable signal SET1. Meantime, the next switching cycle of the first switch M1 begins, and the above operation repeats again.

In the other hand, for the second switching phase 320, at time t0, the first voltage VR is pulled down to zero when the first enable signal SET1 is switched to being active with logic high. Then the first voltage VR increased from zero with a slew rate. Subsequently, at time t2, when the first enable signal SET1 is switched to being active again, the maximum value V1 of the first voltage VR is sampled and held. At time t3, when the first voltage VR increases to reach the second voltage V2, i.e. 0.5*V1, the second enable signal SET2 having a short pulse is generated, the second control signal PWM2 provided by the RS flip-flop FF2 is at the logic high, the second switch M2 is turned ON. At time t4, i.e., after a constant ON-time Ton2 which is determined by the second ON-time control signal TON2, the second switch M2 is turned OFF. When the first voltage VR is increased to reach the second voltage V2, i.e. 0.5*V1 again, the second enable signal SET2 is generated to have another short pulse, the next switching cycle of the second switch M2 begins, the above operation repeats again.

In the embodiment of FIG. 6, the second enable signal SET2 is generated based on the switching operation of the first control signal PWM1, and there is a phase difference of 180° between the first control signal PWM1 and the second enable signal SET2.

The above discussion is about the operation of the system voltage feedback control circuit as an example of the plurality of feedback control circuits 301. In the plurality of feedback control circuits 301 of the two-phase charging circuit 30, the operations of other feedback control circuits are similar with the operation of the system voltage feedback control circuit and will not be discussed for brevity. Persons of ordinary skill in the art will appreciate that when one of feedback control circuits 301 is working, other feedback control signals are all invalid due to the characteristic of the charging circuit 30, and thus have no effect to output of the AND gate circuit AND1.

Figure 7:
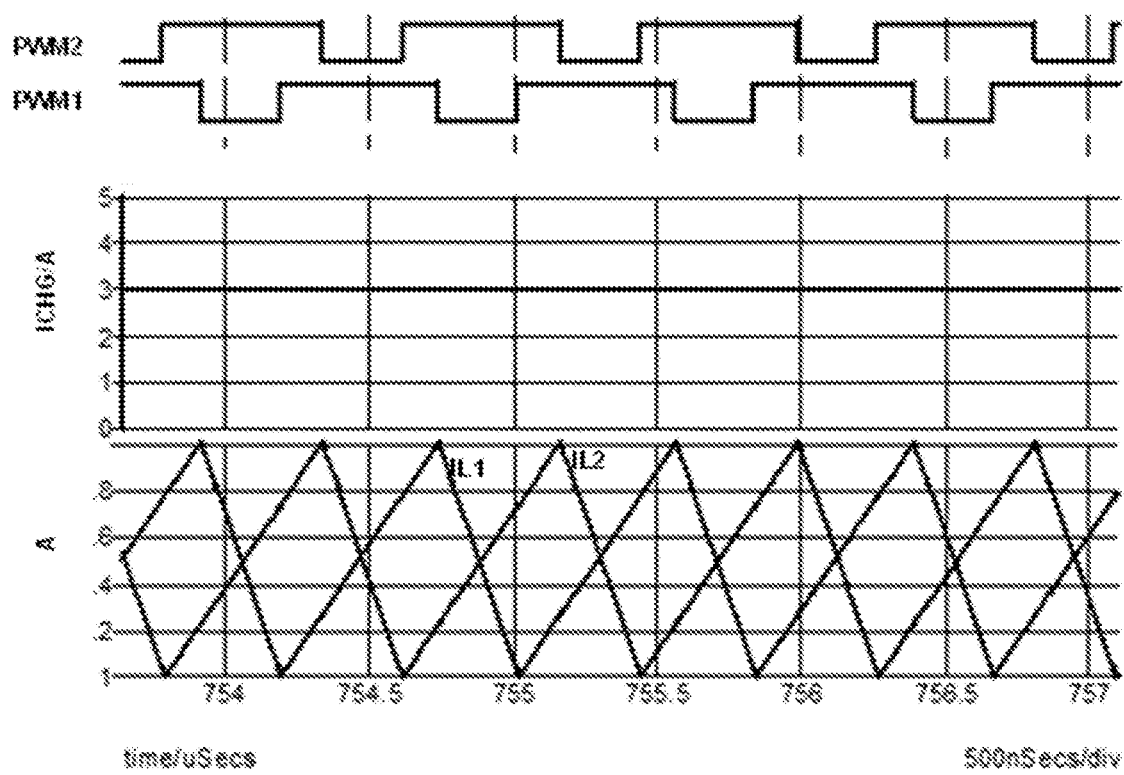
FIG. 7 shows a waveform diagram of the two-phase charging circuit 30 shown in FIG. 4 in a steady-state in accordance with an embodiment of the present invention.

FIG. 7 shows a waveform diagram of the two-phase charging circuit 30 shown in FIG. 4 in a steady-state in accordance with an embodiment of the present invention. FIG. 7 shows in turn the second control signal PWM2, the first control signal PWM1, the charging current ICHG, the first current signal IL1 and a second current signal IL2 representative of a current flowing through the second switching phase 320.

The first switching phase 310 and the second switching phase 320 operates alternately with a phase difference of 180°.

Figure 8:
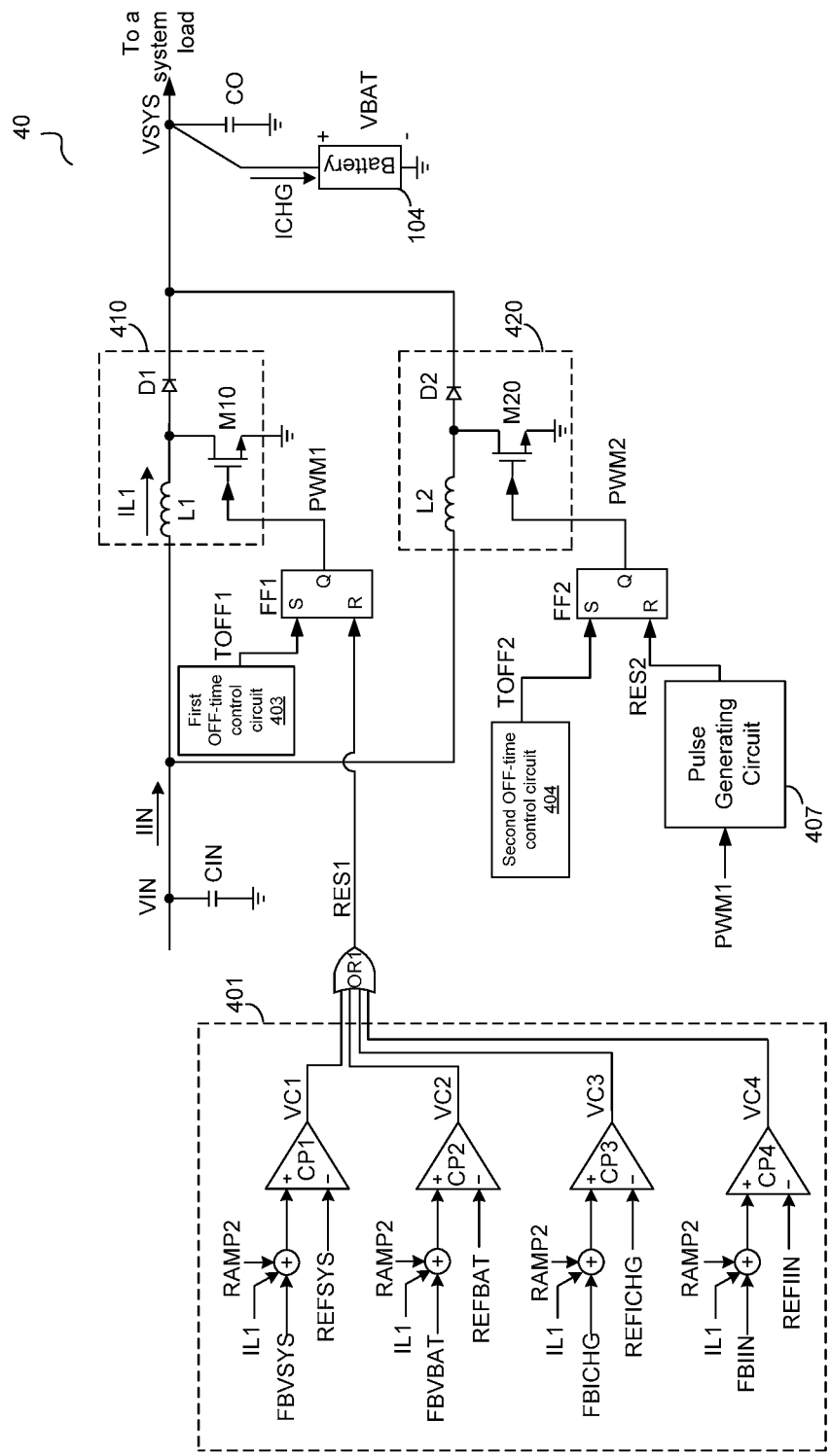
FIG. 8 shows a schematic diagram of a two-phase charging circuit 40 in accordance with another embodiment of the present invention.

FIG. 8 shows a schematic diagram of a two-phase charging circuit 40 in accordance with another embodiment of the present invention. In the embodiment of FIG. 8, the two-phase charging circuit 40 comprises an input capacitor CIN coupled between an input voltage VIN and a ground, an output capacitor CO coupled between a system voltage VSYS and the ground, a first switching phase 410 having a first switch M10, a diode D1 and an inductor L1, a second switching phase 420 having a second switch M20, a diode D2 and an inductor L2, and a control circuit. The first switching phase 410 and the second switching phase 420 may adopt boost topology and is configured to receive the input voltage VIN and provide the system voltage VSYS to a system load and/or provide a charging current ICHG to a battery 104.

In the embodiment of FIG. 8, the control circuit comprises a plurality of feedback control circuits 401, a OR gate circuit OR1, a first OFF-time control circuit 403, a RS flip-flop FF1, a pulse generating circuit 407, a second OFF-time control circuit 404 and a RS flip-flop FF2.

In the embodiment of FIG. 8, the plurality of feedback control circuits 401 comprises a first comparator CP1 to form a system voltage feedback control circuit, a second comparator CP2 to form a battery voltage feedback control circuit, a third comparator CP3 to form a charging current feedback control circuit and a fourth comparator CP4 to form an input current feedback control circuit.

The first comparator CP1 has an inverting input terminal, a non-inverting input terminal and an output terminal, wherein the non-inverting input terminal is configured to receive the sum of a system voltage feedback signal FBVSYS, a ramp signal RAMP2 and the first current signal IL1, the inverting input terminal is configured to receive a system voltage reference signal REFVSYS. The first comparator CP1 is configured to provide a system voltage feedback control signal VC1 at the output terminal based on the system voltage reference signal REFVSYS, the system voltage feedback signal FBVSYS, the ramp signal RAMP2 and the first current signal IL1.

The second comparator CP2 has an inverting input terminal, a non-inverting input terminal and an output terminal, wherein the non-inverting input terminal is configured to receive the sum of a battery voltage feedback signal FBVBAT, the ramp signal RAMP2 and the first current signal IL1, the inverting input terminal is configured to receive a battery voltage reference signal REFVBAT. The second comparator CP2 is configured to provide a battery voltage feedback control signal VC2 at the output terminal based on the battery voltage reference signal REFVBAT, the battery voltage feedback signal FBVBAT, the ramp signal RAMP2 and the first current signal IL1.

The third comparator CP3 has an inverting input terminal, a non-inverting input terminal and an output terminal, wherein the non-inverting input terminal is configured to receive the sum of a charging current feedback signal FBICHG, the ramp signal RAMP2 and the first current signal IL1, the inverting input terminal is configured to receive a charging current reference signal REFICHG. The third comparator CP3 is configured to provide a charging current feedback control signal VC3 at the output terminal based on the charging current reference signal REFICHG, the charging current feedback signal FBICHG, the ramp signal RAMP2 and the first current signal IL1.

The fourth comparator CP4 has an inverting input terminal, a non-inverting input terminal and an output terminal, wherein the non-inverting input terminal is configured to receive the sum of an input current feedback signal FBIIN, the ramp signal RAMP2 and the first current signal IL1, the inverting input terminal is configured to receive an input current reference signal REFIIN. The fourth comparator CP4 is configured to provide an input current feedback control signal VC4 at the output terminal based on the input current reference signal REFIIN, the input current feedback signal FBIIN, the ramp signal RAMP2 and the first current signal IL1.

The OR gate circuit OR1 has four input terminals configured to receive the feedback control signals VC1~VC4 respectively and an output terminal configured to provide a first enable signal RES1. The first OFF-time control circuit 403 is configured to provide a first OFF-time control signal TOFF1, which is used to control the OFF-time of the first switch M1. The RS flip-flop FF1 has a setting terminal, a resetting terminal and an output terminal, wherein the resetting terminal is configured to receive the first enable signal RES1, the setting terminal is configured to receive the first OFF-time control signal TOFF1, and the RS flip-flop FF1 is configured to provide a first control signal PWM1 at the output terminal to control the first switch M10 based on the first enable signal RES1 and the first OFF-time control signal TOFF1.

The pulse generating circuit 407 is configured to receive the first control signal PWM1 and provide a second enable signal RES2 at an output terminal by shifting a predetermined phase difference to the first control signal PWM1. And there is a phase difference of 180° between the first control signal PWM1 and the second enable signal RES2.

The second OFF-time control circuit 404 is configured to generate a second OFF-time control signal TOFF2 at the output terminal to control the OFF-time of the second switch M20. The RS flip-flop FF2 has a setting terminal, a resetting terminal and an output terminal, wherein the setting terminal is configured to receive the second OFF-time control signal TOFF2, the resetting terminal is configured to receive the second enable signal RES2, and the RS flip-flop FF2 is configured to generate the second control signal PWM2 at the output terminal to control the second switch M20 based on the second enable signal RES2 and the second OFF-time control signal TOFF2.

The pulse generating circuit 407 shown in FIG. 8 is similar as the pulse generating circuit 307 shown in FIG. 4, As a result, the detailed circuit and operation of the pulse generating circuit 407 in FIG. 8 is omitted for clarity.

Figure 9:
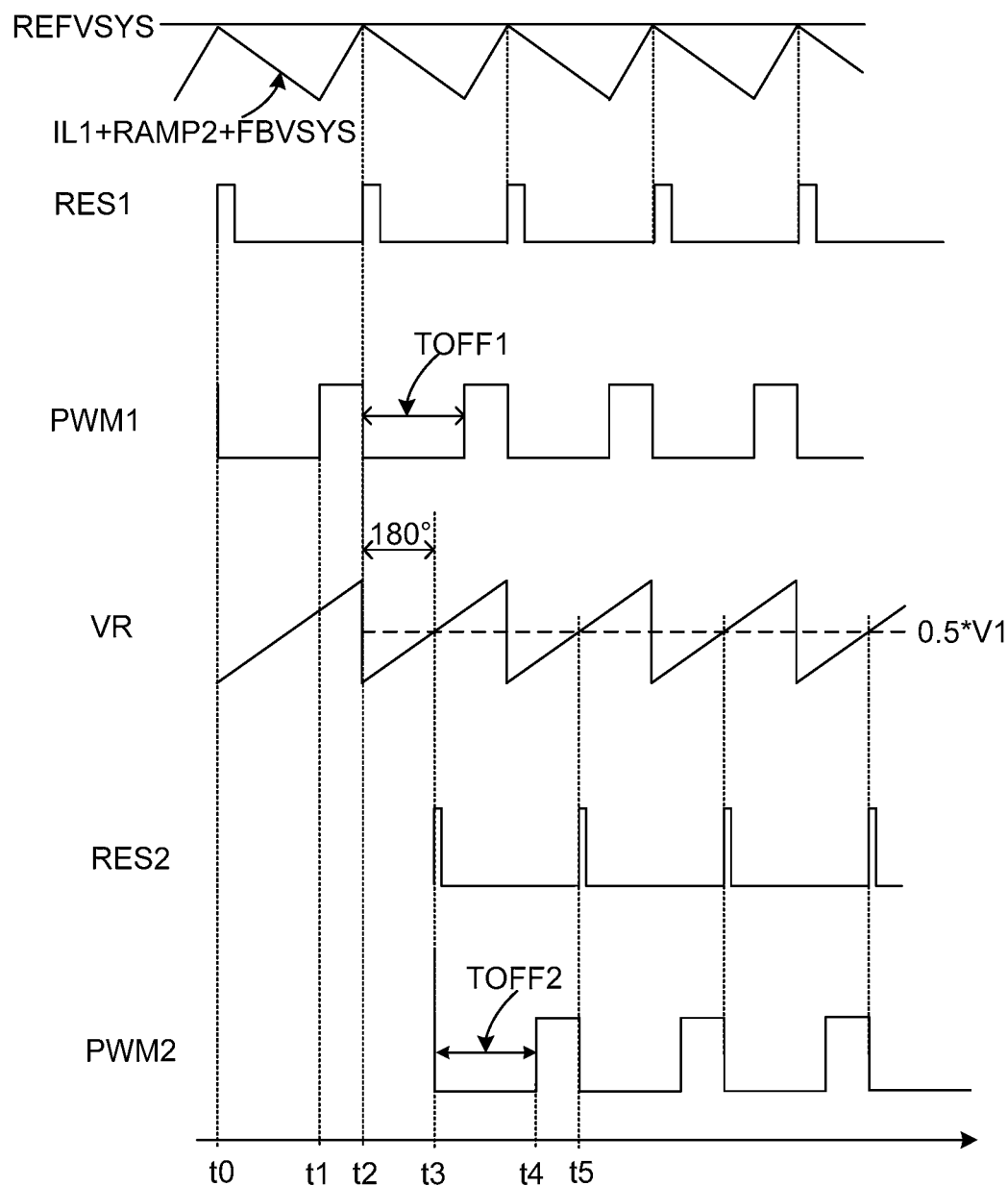
FIG. 9 shows a waveform diagram of signals of the two-phase charging circuit 40 shown in FIG. 8 working based on the system voltage feedback control circuit in accordance with an embodiment of the present invention.

FIG. 9 shows a waveform diagram of signals of the two-phase charging circuit 40 shown in FIG. 8 working based on the system voltage feedback control circuit in accordance with an embodiment of the present invention. The operation of the two-phase charging circuit 40 described below with reference to FIGS. 8 and 9. In detail, the operation of the system voltage feedback control circuit is explained as an example of the operation of the feedback control circuits 401 of the two-phase charging circuit 30.

As shown in FIG. 9, in the one hand, for the first switching phase 410, at time t0, the sum of the system voltage feedback signal FBVSYS, the ramp signal RAMP2 and the first current signal IL1 is increased to reach the system voltage reference signal REFVSYS, and the system voltage feedback control signal VC1 is switched to being active with logic high. Via the OR gate circuit OR1, the system voltage feedback control signal VC1 then resets the RS flip-flop FF1 as the first enable signal RES1. Then the first control signal PWM1 is generated with logic low. As a result, the first switch M10 is turned OFF. At time t1, i.e. after a constant OFF-time Toff1 of the first switch M10 which is determined by the first OFF-time control signal TOFF1, the RS flip-flop FF1 is set and the first control signal PWM1 becomes logic high from logic low, and thus the first switch M10 is turned ON. Subsequently, at time t2, when the sum of the system voltage feedback signal FBVSYS, the ramp signal RAMP2 and the first current signal IL1 is increased to reach the system voltage reference signal REFVSYS again, the system voltage feedback control signal VC1 is switched to being active. Via the OR gate OR1, the system voltage feedback control signal VC1 then resets the RS flip-flop FF1 again as the first enable signal RES1. Meantime, the next switching cycle of the first switch M10 begins, and the above operation repeats again.

In the other hand, for the second switching phase 420, at time t0, the first enable signal RES1 is switched to being active with logic high, the first voltage VR is pulled down to zero, then the first voltage VR increases from zero with a slew rate. Subsequently, at time t2, when the first enable signal RES1 is switched to being active again, the maximum value V1 of the first voltage VR is sampled and held. At time t3, when the first voltage VR increases to reach the second voltage V2, i.e. 0.5*V1, the second enable signal RES2 is generated to have a short pulse, the second control signal PWM2 provided by the RS flip-flop FF2 is at the logic low, the second switch M20 is turned OFF. At time t4, i.e., after a constant OFF-time Toff2 which is determined by the second OFF-time control signal TOFF2, the second switch M20 is turned ON. When the first voltage VR is increased to reach the second voltage V2 again, i.e. 0.5*V1, the second enable signal RES2 is generated again to have another short pulse, the next switching cycle of the second switch M20 begins, the above operation repeats again.

In the embodiment of FIG. 9, the second enable signal RES2 is generated based on the switching operation of the first control signal PWM1, and there is a phase difference of 180° between the first control signal PWM1 and the second enable signal RES2.

The above discussion is about the operation of the system voltage feedback control circuit as an example of the operation of the feedback control circuits 401 of the two-phase charging circuit 40. In the plurality of feedback control circuits 401 of the two-phase charging circuit 40, the operations of the other feedback control circuits are similar with the operation of the system voltage feedback control circuit and will not be discussed for brevity. Persons of ordinary skill in the art will appreciate that when one of feedback control circuits 401 is working, other feedback control signals are all invalid due to the characteristic of the charging circuit 40, and thus have no effect to the OR gate circuit OR1.

In one embodiment, the control circuit further comprises a current balance control circuit. The current balance circuit is configured to receive the first current signal IL1 and a second current signal IL2 representative of a current flowing through the second switching phase 420, and wherein the first OFF-time control signal TOFF1 provided by the first OFF-time control circuit 403 and the second OFF-time control signal TOFF2 provided by the second OFF-time control circuit 404 are regulated based on the first current signal IL1 and the second current signal IL2. In one embodiment, when a condition that the first current signal IL1 is higher than a predetermined value of the second current signal IL2 is sensed, the current balance control circuit regulates the first OFF-time control signal TOFF1 to prolong the OFF-time of the first switch M10 and regulates the second OFF-time control signal TOFF2 to shorten the OFF-time of the second switch M20. Similarly, when another condition that the second current signal IL2 is higher than a predetermined value of the first current signal IL1 is sensed, the current balance control circuit regulates the first OFF-time control signal TOFF1 to shorten the OFF-time of the first switch M10 and regulates the second OFF-time control signal TOFF2 to prolong the OFF-time of the second switch M20. In another embodiment, the current balance circuit could be digital circuit.

Figure 10:
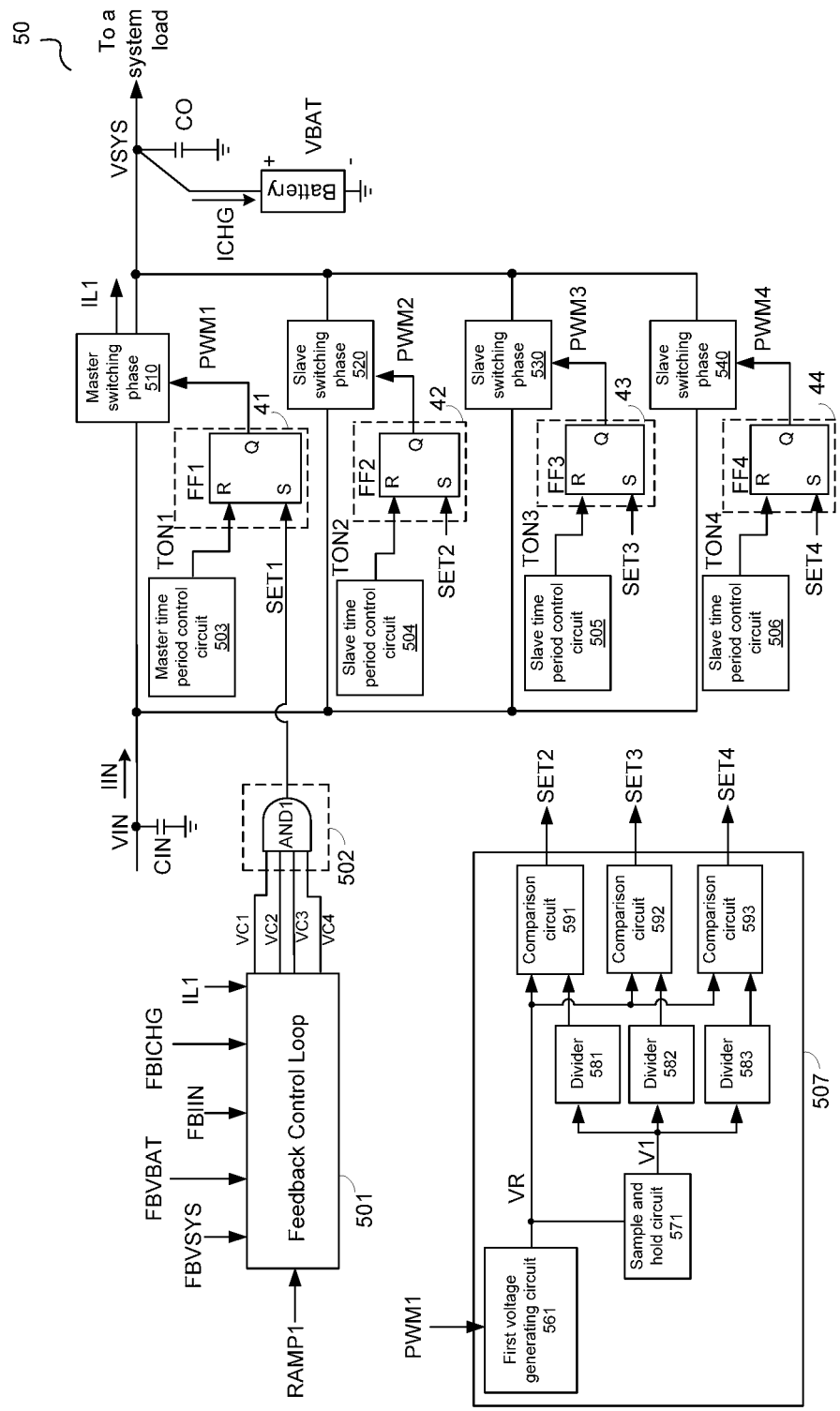
FIG. 10 shows a schematic diagram of a four-phase charging circuit 50 in accordance with an embodiment of the present invention.

FIG. 10 shows a schematic diagram of a four-phase charging circuit 50 in accordance with an embodiment of the present invention. In the embodiment of FIG. 10, the four-phase charging circuit 50 comprises an input capacitor CIN coupled an input voltage VIN and a ground, an output capacitor CO coupled between a system voltage VSYS and the ground, four switching phases 510~540 and a control circuit. Wherein only one of the four phases is a master phase, and other phases are slave phases. In the embodiment of FIG. 10, a first switching phase 510 is the master phase having a first switch.

In the embodiment of FIG. 10, the control circuit comprises a plurality of feedback control circuits 501, a logic grouping circuit 502, a master time period control circuit 503, a master logic circuit 41, a pulse generating circuit 507, three slave time period control circuits 504~506, three slave logic circuits 42~44.

The plurality of feedback control circuits 501 is configured to generate four feedback control signals VC1~VC4. The logic grouping circuit 502 has four input terminals configured to receive feedback control signals VC1~VC4 respectively and is configured to select one of the four feedback control signals VC1~VC4 as a first enable signal SET1 at an output terminal. In the embodiment of FIG. 10, the logic grouping circuit 502 comprises a AND gate circuit. In another embodiment, the logic grouping circuit 502 comprises a OR gate circuit.

The master time period control circuit 503 is configured to generate a master time period control signal TON1. In the embodiment of FIG. 10, the master time period control signal TON1 is configured to control the ON-time of the first switch. In another embodiment, the master time period control signal TON1 is configured to control the OFF-time of the first switch.

The master logic circuit 41 is configured to receive the first enable signal SET1 and the master time period control signal TON1 and provide a first control signal PWM1 at an output terminal to control the first switch based on the first enable signal SET1 and the master time period control signal TON1. In one embodiment, the master logic circuit 41 comprises a RS flip-flop FF1.

The pulse generating circuit 507 has an input terminal configured to receive the first control signal PWM1 and three output terminals configured to generate three slave enable signals SET2~SET4 respectively for three slave switching phases 520~540. There is a phase difference of 90° between the first control signal PWM1 and the salve enable signal SET2, there is a phase difference of 180° between the first control signal PWM1 and the slave enable signal SET3, there is a phase difference of 270° between the first control signal PWM1 and the slave enable signal SET4. In one embodiment, the pulse generating circuit 507 comprises a first voltage generating circuit 561, a sample and hold circuit 571, three divider circuit 581~583 and three comparison circuits 591~593. The first voltage generating circuit 561 is configured to generate a first voltage VR. The first voltage VR is pulled down to zero when the first enable signal SET1 is be active and increases with a slew rate until the first enable signal SET1 is be active again. The sample and hold circuit 571 is configured to sample and hold a maximum value V1 of the first voltage VR. The divider circuits 581~583 are configured to divide the maximum value V1 of the first voltage VR and provide three salve voltages, i.e., 0.25*V1, 0.5*V1 and 0.75*V1. The comparison circuits 591~593 are configured to compare the first voltage VR and the slave voltages 0.25*V1, 0.5*V1 and 0.75*V1, and provide the slave enable signals SET2, SET3 and SET4, respectively.

The slave time period control circuits 504, 505 and 506 generate the slave time period control signals TON2, TON3 and TON4. Each of slave time period control circuit 504~506 is configured to generate a corresponding slave time period control signal. Each of slave logic circuits 42~44 is configured to receive a corresponding slave enable signal and a corresponding slave time period control signal and provide a corresponding control signal to control a switch of the corresponding slave phase, based on the corresponding slave enable signal and the corresponding slave time period control signal.

Figure 11:
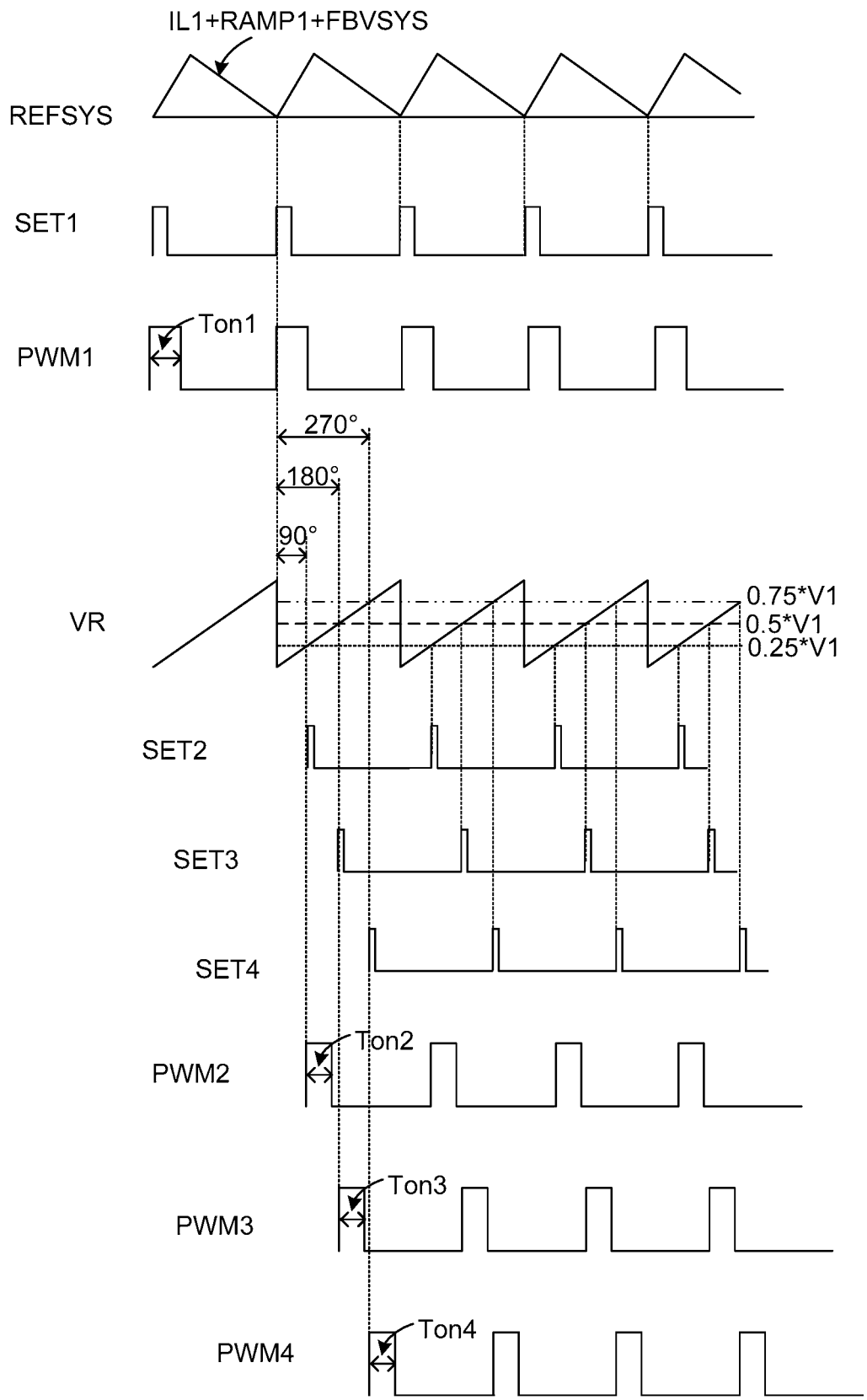
FIG. 11 shows a waveform diagram of signals of the four-phase charging circuit 50 shown in FIG. 10 in operation based on the system voltage feedback control circuit in accordance with an embodiment of the present invention.

FIG. 11 shows a waveform diagram of signals of the four-phase charging circuit 50 shown in FIG. 10 in operation based on the system voltage feedback control circuit in accordance with an embodiment of the present invention. Salve enable signals SET2, SET3 and SET4 are generated based on the switching operation of the first control signal PWM1. When the first voltage VR increases to reach the slave voltages 0.25*V1, 0.5*V1 and 0.75*V1, the slave enable signals SET1, SET2 and SET3 are generated respectively. And in detail, there is a phase difference of 90° between the first control signal PWM1 and SET2, a phase difference of 180° between the first control signal PWM1 and SET3, a phase difference of 270° between the first control signal PWM1 and SET4.

Figure 12:
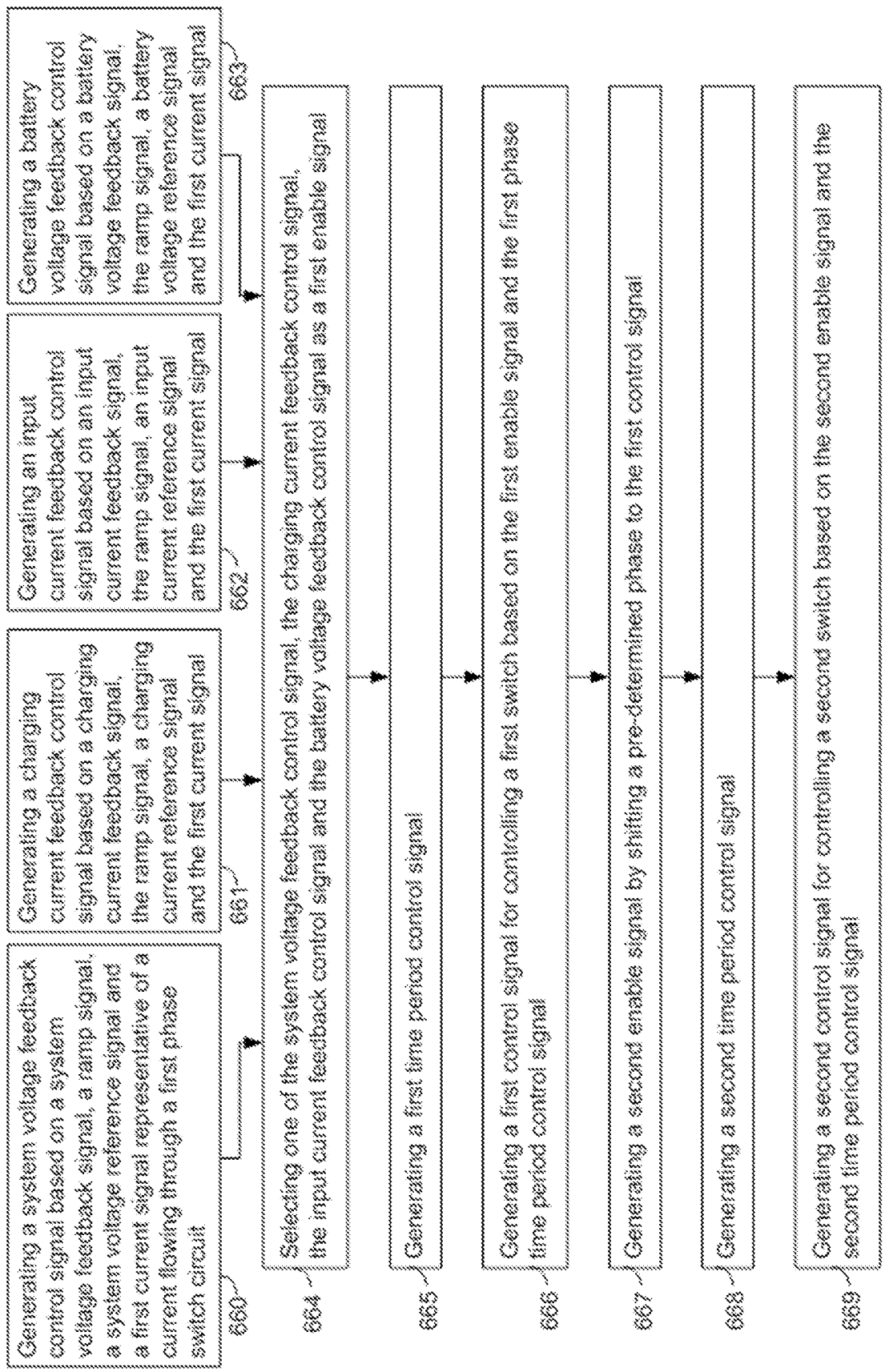
FIG. 12 shows a work flow of a control method for controlling a multi-phase charging circuit in accordance with an embodiment of the present invention.

FIG. 12 shows a work flow of a control method for controlling a multi-phase charging circuit in accordance with an embodiment of the present invention. The multi-phase charging circuit comprises a plurality of switching phases receiving an input voltage and providing a system voltage for a system load, wherein the plurality of switching phases comprises a first phase having a first switch and a second phase having a second switch, the control method comprises steps 660~669.

At step 660, based on a system voltage feedback signal, a ramp signal, a system voltage reference signal and a first current signal representative of a current flowing through a first switching phase, a system voltage feedback control signal is generated.

At step 661, based on a charging current feedback signal, the ramp signal, a charging current reference signal and the first current signal, a charging current feedback control signal is generated.

At step 662, based on an input current feedback signal, the ramp signal, an input current reference signal and the first current signal, an input current feedback control signal is generated.

At step 663, based on a battery feedback signal, the ramp signal, a battery voltage reference signal and the first current signal, a battery voltage feedback control signal is generated.

At step 664, one of the system voltage feedback control signal, the charging current feedback control signal, the input current feedback control signal and the battery voltage feedback control signal is selected as a first enable signal.

At step 665, a first time period control signal is generated.

At step 666, based on the first enable signal and the first time period control signal, a first control signal for controlling the first switch is generated.

At step 667, a second enable signal is generated by shifting a pre-determined phase to the first control signal.

At step 668, a second time period control signal is generated.

At step 669, a second control signal for controlling the second switch is generated based on the second enable signal and the second time period control signal.

In one embodiment, the first and second switching phases adopt buck topology, the first switch is turned ON when the first enable signal is switched to being active, the first time period control signal is configured to control the ON-time of the first switch, and the second switch is turned ON when the second enable signal is switched to being active, the second time period control signal is configured to control the ON-time of the second switch.

In another embodiment, the first and second switching phases adopt boost topology, the first switch is turned OFF when the first enable signal is switched to being active, the first time period control signal is configured to control the OFF-time of the first switch, and the second switch is turned OFF when the second enable signal is switched to being active, the second time period control signal is configured to control the OFF-time of the second switch.

In one embodiment, the step S667 further comprises: generating a first voltage, wherein the first voltage is pulled down to zero when the first enable signal is switched to being active and the first voltage increases with a slew rate until the first enable signal is switched to being active again; sampling and holding a maximum value of the first voltage; generating a second voltage by dividing the maximum value of the first voltage, wherein the second voltage is proportional to the pre-determined phase; and comparing the first voltage with the second voltage and generating the second enable signal.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. A control circuit used in a multiphase charging circuit, wherein the multiphase charging circuit comprises a plurality of switching phases receiving an input voltage and providing a system voltage for a system load, wherein the plurality of switching phases comprises a first phase having a first switch and a second phase having a second switch, the control circuit comprising:
    a plurality of feedback control circuits configured to provide a plurality of feedback control signals, wherein each of feedback control circuits is configured to receive a corresponding feedback signal, a ramp signal, a corresponding reference signal and a first current signal representative of a current flowing through the first phase and provide a corresponding feedback control signal;
    a AND gate circuit having a plurality of input terminals configured to respectively receive the plurality of feedback control signals and an output terminal configured to provide a first enable signal;
    a first ON-time control circuit configured to generate a first ON-time control signal for controlling the ON-time of the first switch;
    a first flip-flop having a setting terminal configured to receive the first enable signal, a resetting terminal configured to receive the first ON-time control signal, and an output terminal, wherein the first flip-flop provides a first control signal at the output terminal to control the first switch;
    a pulse generating circuit configured to receive the first control signal and provide a second enable signal by shifting a pre-determined phase difference to the first control signal;
    a second ON-time control circuit configured to generate a second ON-time control signal for controlling the ON-time of the second switch; and
    a second flip-flop having a setting terminal configured to receive the second enable signal, a resetting terminal configured to receive the second ON-time control signal, and an output terminal, wherein the second flip-flop provides a second control signal at the output terminal to control the second switch.

2. The control circuit of claim 1, wherein the pulse generating circuit comprises:
    a delay circuit having an input terminal configured to receive the first control signal and an output terminal configured to provide a delay signal; and
    a first short pulse circuit configured to receive the delay signal and provide the second enable signal having a short pulse at an output terminal.

3. The control circuit of claim 2, wherein the delay circuit comprises:
    a first voltage generating circuit configured to generate the first voltage, wherein the first voltage is pulled down to zero when the first switch is turned ON and increases with a slew rate until the first switch is turned ON again;
    a sample and hold circuit configured to sample and hold a maximum value of the first voltage;
    a divider circuit configured to divide the maximum value of the first voltage and provide a second voltage, wherein the second voltage is proportional to the pre-determined phase difference; and
    a comparison circuit configured to compare the first voltage with the second voltage and provide the delay signal.

4. The control circuit of claim 3, wherein the first voltage generating circuit comprises:
    a second short pulse circuit configured to receive the first control signal and provide a second short pulse signal at an output terminal;
    a discharge switch having a first terminal configured to provide the first voltage, a second terminal coupled to a ground, and a control terminal configured to receive the second short pulse signal;

a charge capacitor having a first terminal coupled to the first terminal of the discharge switch and a second terminal coupled to the ground; and a charge current source having a first terminal coupled to the first terminal of the charge capacitor and a second terminal coupled to the ground.

5. The control circuit of claim 1, wherein the plurality of feedback control circuits comprises:

a first comparator having a non-inverting input terminal to receive a system voltage reference signal and an inverting input terminal to receive the sum of a system voltage feedback signal, the ramp signal and the first current signal, and wherein the first comparator is configured to provide a system voltage feedback control signal based on the system voltage reference signal, the ramp signal, the system voltage feedback signal and the first current signal;

a second comparator having a non-inverting input terminal to receive a battery voltage reference signal and an inverting input terminal to receive the sum of a battery voltage feedback signal, the ramp signal and the first current signal, and wherein the second comparator is configured to provide a battery voltage feedback control signal based on the battery voltage reference signal, the ramp signal, the battery voltage feedback signal and the first current signal;

a third comparator having a non-inverting input terminal to receive a charging current reference signal and an inverting input terminal to receive the sum of a charging current feedback signal, the ramp signal and the first current signal, and wherein the third comparator is configured to provide a charging current feedback control signal based on the charging current reference signal, the ramp signal, the charging current feedback signal and the first current signal; and a fourth comparator having a non-inverting input terminal to receive an input current reference signal and an inverting input terminal to receive the sum of an input current feedback signal, the ramp signal and the first current signal, and wherein the fourth comparator is configured to provide an input current feedback control signal based on the input current reference signal, the ramp signal, the input current feedback signal and the first current signal.

6. A control circuit used in a multiphase charging circuit, wherein the multiphase charging circuit comprises a plurality of switching phases receiving an input voltage and providing a system voltage for a system load, wherein the plurality of switching phases comprises a first phase having a first switch and a second phase having a second switch, the control circuit comprising:

a plurality of feedback control circuits configured to provide a plurality of feedback control signals, wherein each of feedback control circuits is configured to receive a corresponding feedback signal, a ramp signal, a corresponding reference signal and a first current signal representative of a current flowing through the first phase and provide a corresponding feedback control signal;

an OR gate circuit having a plurality of input terminals configured to respectively receive the plurality of feedback control signals and an output terminal configured to provide a first enable signal;

a first OFF-time control circuit configured to generate a first OFF-time control signal for controlling the OFF-time of the first switch;

a first flip-flop having a setting terminal configured to receive the first OFF-time control signal, a resetting terminal configured to receive the first enable signal, and an output terminal, wherein the first flip-flop provides a first control signal at the output terminal to control the first switch;

a pulse generating circuit configured to receive the first control signal and provide a second enable signal by shifting a pre-determined phase difference to the first control signal;

a second OFF-time control circuit configured to generate a second OFF-time control signal for controlling the OFF-time of the second switch; and a second flip-flop having a setting terminal coupled to receive the second OFF-time control signal, a resetting terminal configured to receive the second on enable signal, and an output terminal, wherein the second flip-flop provides a second control signal at the output terminal to control the second switch.

7. The control circuit of claim 6, wherein the pulse generating circuit comprises:

a delay circuit having an input terminal configured to receive the first control signal and an output terminal configured to provide a delay signal; and a first short pulse circuit configured to receive the delay signal and provide the second enable signal having a short pulse at an output terminal.

8. The control circuit of claim 7, wherein the delay circuit comprises:

a first voltage generating circuit configured to generate the first voltage, wherein the first voltage is pulled down to zero when the first switch is turned OFF and the first voltage increases with a slew rate until the first switch is turned OFF again;

a sample and hold circuit configured to sample and hold a maximum value of the first voltage;

a divider circuit configured to divide the maximum value of the first voltage and provide a second voltage, wherein the second voltage is proportional to the pre-determined phase difference; and a comparison circuit configured to compare the first voltage with the second voltage and provide the delay signal.

9. The control circuit of claim 8, wherein the first voltage generating circuit comprises:

a second short pulse circuit configured to receive the first control signal through an inverter and provide a second short pulse signal at an output terminal;

a discharge switch having a first terminal configured to provide the first voltage, a second terminal coupled to a ground, and a control terminal configured to receive the second short pulse signal;

a charge capacitor having a first terminal coupled to the first terminal of the discharge switch and a second terminal coupled to the ground; and a charge current source having a first terminal coupled to the first terminal of the charge capacitor and a second terminal coupled to the ground.

10. The control circuit of claim 6, wherein the plurality of feedback control circuits comprises:

a first comparator having an inverting input terminal to receive a system voltage reference signal and a non-inverting input terminal to receive the sum of a system voltage feedback signal, the ramp signal and the first current signal, and wherein the first comparator is configured to provide a system voltage feedback control signal based on the system voltage reference signal, the ramp signal, the system voltage feedback signal and the first current signal;

a second comparator having an inverting input terminal to receive a battery voltage reference signal and a non-inverting input terminal to receive the sum of a battery voltage feedback signal, the ramp signal and the first current signal, and wherein the second comparator is configured to provide a battery voltage feedback control signal based on the battery voltage reference signal, the ramp signal, the battery voltage feedback signal and the first current signal;

a third comparator having an inverting input terminal to receive a charging current reference signal and a non-inverting input terminal to receive the sum of a charging current feedback signal, the ramp signal and the first current signal, and wherein the third comparator is configured to provide a charging current feedback control signal based on the charging current reference signal, the ramp signal, the charging current feedback signal and the first current signal; and a fourth comparator having an inverting input terminal to receive an input current reference signal and a non-inverting input terminal to receive the sum of an input current feedback signal, the ramp signal and the first current signal, and wherein the fourth comparator is configured to provide an input current feedback control signal based on the input current reference signal, the ramp signal, the input current feedback signal and the first current signal.

11. A multiphase charging circuit, comprising:

a plurality of switching phases configured to receive an input voltage and to provide a system voltage for a system load, wherein only one of the phases is a master phase having a first switch, and other phases are slave phases;

a plurality of feedback control circuits configured to provide a plurality of feedback control signals, wherein each of feedback control circuits is configured to receive a corresponding feedback signal, a ramp signal, a corresponding reference signal and a first current signal representative of a current flowing through the master phase and provide a corresponding feedback control signal based on the corresponding feedback signal, the ramp signal, the corresponding reference signal and the first current signal;

a logic grouping circuit having a plurality of input terminals configured to receive the plurality of feedback control signals and an output terminal configured to select one of the plurality of feedback control signals as a first enable signal;

a master time period control circuit configured to generate a master time period control signal;

a master logic circuit configured to receive the first enable signal and the master time period control signal and provide a first control signal to control the first switch;

a pulse generating circuit having an input terminal configured to receive the first control signal and a plurality of output terminals configured to provide a plurality of slave enable signals, wherein each of slave enable signals is generated by shifting the first control signal a corresponding phase difference;

a plurality of slave time period control circuits with each of slave time period control circuits configured to provide the corresponding slave time period control signal; and a plurality of slave logic circuits with each of slave logic circuits configured to receive the corresponding slave enable signal and the corresponding slave time period control signal and provide a corresponding slave control signal to control a switch of the corresponding slave phase.

12. The multiphase charging circuit of claim 11, wherein the pulse generating circuit comprises:

a first voltage generating circuit configured to generate the first voltage, wherein the first voltage is pulled down to zero when the first enable signal is switched from being inactive to being active and the first voltage increases with a slew rate until the first enable signal is switched from being inactive to being active again;

a sample and hold circuit configured to sample and hold a maximum value of the first voltage;

a plurality of divider circuits with each of divider circuits configured to divide the maximum value of the first voltage and provide a corresponding dividing voltage, wherein each dividing voltage is proportional to the corresponding phase difference; and a plurality of comparison circuits with each of comparison circuits configured to compare the first voltage with the corresponding dividing voltage and provide a corresponding comparison signal; and a plurality of short pulse circuits configured to provide a plurality of slave enable signals, wherein each of short pulse circuits is configured to receive the corresponding comparison signal and provide the corresponding slave enable signal at the corresponding output terminal.

13. The multiphase charging circuit of claim 11, wherein the pulse generating circuit comprises:

a plurality of delay circuits with each of delay circuits configured to receive the first control signal and to provide a corresponding delay signal; and a plurality of short pulse circuits with each of short pulse circuits configured to receive the corresponding delay signal and provide the corresponding slave enable signal at the corresponding output terminal.

14. The multiphase charging circuit of claim 11, wherein the plurality of feedback control circuits comprises:

a first comparator having a first input terminal to receive a system voltage reference signal and a second input terminal to receive the sum of a system voltage feedback signal, the ramp signal and the first current signal, and wherein the first comparator is configured to provide a system voltage feedback control signal based on the system voltage reference signal, the ramp signal, the system voltage feedback signal and the first current signal;

a second comparator having a first input terminal to receive a battery voltage reference signal and a second input terminal to receive the sum of a battery voltage feedback signal, the ramp signal and the first current signal, and wherein the second comparator is configured to provide a battery voltage feedback control signal based on the battery voltage reference signal, the ramp signal, the battery voltage feedback signal and the first current signal;

a third comparator having a first input terminal to receive a charging current reference signal and a second input terminal to receive the sum of a charging current feedback signal, the ramp signal and the first current signal, and wherein the third comparator is configured to provide a charging current feedback control signal based on the charging current reference signal, the ramp signal, the charging current feedback signal and the first current signal; and a fourth comparator having a first input terminal to receive an input current reference signal and a second input terminal to receive the sum of an input current feedback signal, the ramp signal and the first current signal, and wherein the fourth comparator is configured to provide an input current feedback control signal based on the input current reference signal, the ramp signal, the input current feedback signal and the first current signal.

15. A control method for controlling a multiphase charging circuit, wherein the multiphase charging circuit comprises a plurality of switching phases to provide a system voltage for a system load, the plurality of switching phases comprises a first phase having a first switch and a second phase having a second switch, the control method comprising:

generating a system voltage feedback control signal based on a system voltage reference signal, a ramp signal, a system voltage feedback signal and a first current signal representative of a current flowing through the first phase;

generating a charging current feedback control signal based on a charging current reference signal, the ramp signal, a charging current feedback signal and the first current signal;

generating an input current feedback control signal based on an input current reference signal, the ramp signal, an input current feedback signal and the first current signal;

generating a battery voltage feedback control signal based on a battery voltage reference signal, the ramp signal, a battery voltage feedback signal and the first current signal;

selecting one of the system voltage feedback control signal, the charging current feedback control signal, the input current feedback control signal and the battery voltage feedback control signal as a first enable signal;

generating a first time period control signal;

generating a first control signal based on the first enable signal and the first time period control signal, to control the first switch;

generating a second enable signal by shifting a pre-determined phase difference to the first control signal;

generating a second time period control signal; and generating a second control signal based on the second enable signal and the second time period control signal, to control the second switch.

16. The control method of claim 15, wherein:

the first switch is turned ON when the first enable signal is switched to being active, and the first time period control signal is configured to control the ON-time of the first switch; and the second switch is turned ON when the second enable signal is switched to being active, and the second time period control signal is configured to control the ON-time of the second switch.

17. The control method of claim 15, wherein:

the first switch is turned OFF when the first enable signal is switched to being active, and the first time period control signal is configured to control the OFF-time of the first switch; and the second switch is turned OFF when the second enable signal is switched to being active, and the second time period control signal is configured to control the OFF-time of the second switch.

18. The control method of claim 15, wherein generating the second enable signal comprises:

generating a first voltage, wherein the first voltage is pulled down to zero when the first enable signal is switched to being active and the first voltage increases with a slew rate until the first enable signal is switched to being active again;

sampling and holding a maximum value of the first voltage;

dividing the maximum value of the first voltage to generate a second voltage, wherein the second voltage is proportional to the pre-determined phase difference; and comparing the first voltage with the second voltage to generate a second enable signal.

* * * * *